US012641949B2

(12) United States Patent
Ao et al.

(10) Patent No.: US 12,641,949 B2
(45) Date of Patent: May 26, 2026

(54) LIGHT-EMITTING DEVICE, PREPARATION METHOD THEREFOR, AND DISPLAY APPARATUS

(71) Applicant: TCL TECHNOLOGY GROUP CORPORATION, Huizhou (CN)

(72) Inventors: Zitong Ao, Huizhou (CN); Jiating Hong, Huizhou (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 243 days.

(21) Appl. No.: 18/565,139

(22) PCT Filed: Sep. 6, 2022

(86) PCT No.: PCT/CN2022/117312
§ 371 (c)(1),
(2) Date: Dec. 1, 2023

(87) PCT Pub. No.: WO2023/051197
PCT Pub. Date: Apr. 6, 2023

(65) Prior Publication Data
US 2024/0298460 A1 Sep. 5, 2024

(30) Foreign Application Priority Data

Sep. 30, 2021 (CN) .......................... 202111161167.2

(51) Int. Cl.
*H10K 50/81* (2023.01)
*H10K 50/16* (2023.01)
(Continued)

(52) U.S. Cl.
CPC ............. *H10K 50/81* (2023.02); *H10K 50/16* (2023.02); *H10K 50/82* (2023.02); *H10K 71/60* (2023.02);
(Continued)

(58) Field of Classification Search
CPC ........ H10K 50/81; H10K 50/16; H10K 50/82; H10K 71/60; H10K 2102/102;
(Continued)

(56) References Cited

U.S. PATENT DOCUMENTS 12,369,483 B2 * 7/2025 Park ..................... H10K 50/115
2009/0128029 A1 5/2009 Macelwee et al.
(Continued)

FOREIGN PATENT DOCUMENTS

CN 109234673 A 1/2019

OTHER PUBLICATIONS

International Search Report in International application No. PCT/CN2022/117312, mailed on Oct. 20, 2022.
(Continued)

*Primary Examiner* — Douglas W Owens
(74) *Attorney, Agent, or Firm* — Menachem Nathan; Nathan & Associates

(57) ABSTRACT
The present disclosure discloses a light-emitting device, a preparation method therefor, and a display apparatus. A first and a second passivation protection functional layer are disposed between a first electrode and a light-emitting layer and between a second electrode and the light-emitting layer, and laser damage thresholds of the first and the second passivation protection functional layer are both greater than a laser damage threshold of the light-emitting layer.

20 Claims, 4 Drawing Sheets

(51) Int. Cl.
    *H10K 50/82*       (2023.01)
    *H10K 71/60*       (2023.01)
    *H10K 102/10*     (2023.01)

(52) U.S. Cl.
    CPC . *H10K 2102/102* (2023.02); *H10K 2102/103*
                                      (2023.02)

(58) Field of Classification Search
    CPC .......... H10K 2102/103; H10K 50/805; H10K
                          50/844; H10K 71/00
    See application file for complete search history.

(56)                    References Cited

U.S. PATENT DOCUMENTS

2021/0193876 A1*  6/2021  Chen .................... H10K 71/621
2022/0131108 A1*  4/2022  Park ...................... H10K 50/18

OTHER PUBLICATIONS

Written Opinion of the International Search Authority in International application No. PCT/CN2022/117312, mailed on Oct. 20, 2022.

* cited by examiner

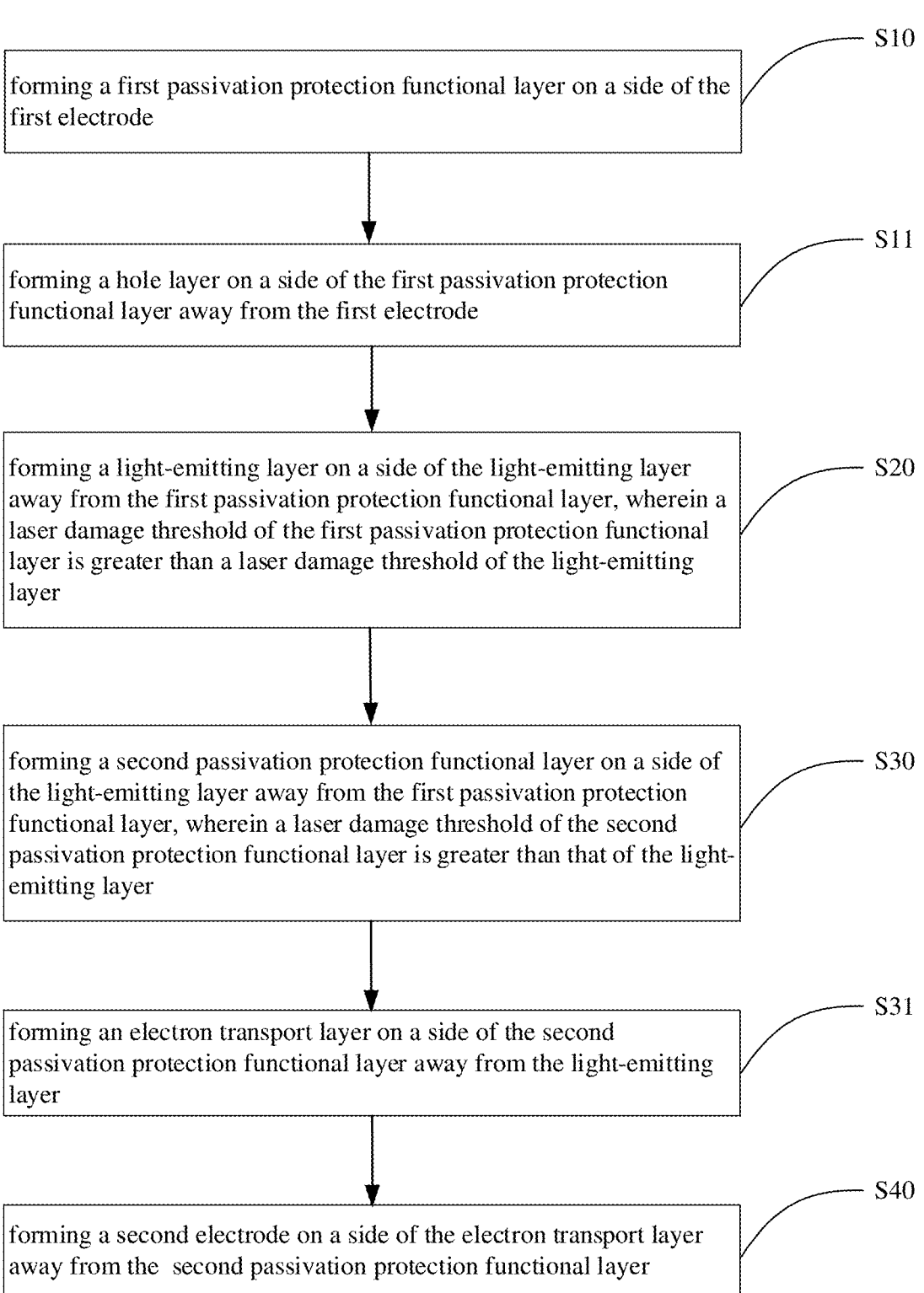

forming a first passivation protection functional layer on a side of the first electrode — S10 forming a hole layer on a side of the first passivation protection functional layer away from the first electrode — S11 forming a light-emitting layer on a side of the light-emitting layer away from the first passivation protection functional layer, wherein a laser damage threshold of the first passivation protection functional layer is greater than a laser damage threshold of the light-emitting layer — S20 forming a second passivation protection functional layer on a side of the light-emitting layer away from the first passivation protection functional layer, wherein a laser damage threshold of the second passivation protection functional layer is greater than that of the light-emitting layer — S30 forming an electron transport layer on a side of the second passivation protection functional layer away from the light-emitting layer — S31 forming a second electrode on a side of the electron transport layer away from the second passivation protection functional layer — S40

FIG. 4

LIGHT-EMITTING DEVICE, PREPARATION METHOD THEREFOR, AND DISPLAY APPARATUS

This disclosure claims priority of the Chinese patent disclosure with the Chinese Patent Application No. 202111161167.2, filed in the China National Intellectual Property Administration on Sep. 30, 2021, and entitled "LIGHT-EMITTING DEVICE, PREPARATION METHOD THEREFOR, AND DISPLAY APPARATUS", which is incorporated herein by reference in its entirety.

TECHNICAL FIELD

The present disclosure relates to a field of display technologies, and more particularly, to a light-emitting device, a preparation method therefor, and a display apparatus including the light-emitting device.

BACKGROUND

Quantum Dots Light-Emitting Diode (QLED) is a new display device. A structure of the QLED is similar to a structure of an Organic Light-Emitting Diode (OLED), that is a sandwich structure composed of a hole transport layer, a light-emitting layer, and an electron transport layer. This is a new technology between the liquid crystal and the OLED. A core technology of the QLED is "quantum dots". The quantum dots are particles with a diameter less than 10 nm, which are mainly composed of zinc atom, cadmium atom, sulfur atom, and selenium atom. This substance possesses extremely unique properties: when quantum dots are stimulated by photoelectricity, they will emit colored light, and the color of the light is determined by materials that make up the quantum dots, sizes of the quantum dots, and shapes of the quantum dots. Because the quantum dots possess the properties, they can change color of a light emitted by a light source. A wavelength range of the quantum dots is very narrow, and the color of the quantum dots is pure and adjustable, so a picture of the quantum dot display will be clearer and brighter than that of liquid crystal display.

QLED is an electroluminescence technology based on inorganic semiconductor quantum dots. Theoretically, the stability of the inorganic semiconductor quantum dots is higher than that of organic small molecules and polymers. On the other hand, due to the quantum confinement effect, an emission width of quantum dot materials is smaller, which makes them have better color purity.

However, when the QLED is driven for a long time, optical catastrophic damage (COD) will appear. QLED is excited to emit light and output light by a gain part of a semiconductor active region. When an output power gradually increases, a cavity surface region absorbs light, which result in generating heat and triggering "thermal runaway", and finally becomes irreversible optical damage, that is, the optical catastrophe damage (COD).

Technical Problems

Accordingly, a probability of the optical catastrophic damage (COD) of the QLED needs to be reduced, and a service life of QLED needs to be improved.

Technical Solutions

Accordingly, the present disclosure provides a light-emitting device, a preparation method therefor, and a display apparatus including the light-emitting device.

Embodiments of the present disclosure provide a light-emitting device. The light-emitting device includes a first electrode, a first passivation protection functional layer, a light-emitting layer, a second passivation protection functional layer, and a second electrode. Wherein, the light-emitting layer is disposed between the first electrode and the second electrode, the first passivation protection functional layer is disposed between the first electrode and the light-emitting layer, the second passivation protection functional layer is disposed between the second electrode and the light-emitting layer, and a laser damage threshold of the first passivation protection functional layer and a laser damage threshold of the second passivation protection functional layer are both greater than a laser damage threshold of the light-emitting layer.

Alternatively, in some embodiments of the present disclosure, the light-emitting device further includes a hole layer, and the hole layer is disposed between the first electrode and the first passivation protection functional layer.

Alternatively, in some embodiments of the present disclosure, a material of the first passivation protection functional layer includes zirconia.

Alternatively, in some embodiments of the present disclosure, a material of the light-emitting layer is selected from one or more of group II-VI compound, group III-V compound, group II-V compound, group III-VI compound, group IV-VI compound, group I-III-VI compound, group II-IV-VI compound, and group IV compound.

Alternatively, in some embodiments of the present disclosure, a material of the first electrode is selected from one or more of indium-doped tin oxide, fluorine-doped tin oxide, antimony-doped tin oxide, and aluminum-doped zinc oxide. A material of the second electrode is selected from one or more of a metal material, a carbon material, and a metal oxide material.

Alternatively, in some embodiments of the present disclosure, the light-emitting device further includes an electron transport layer. The electron transport layer is disposed between the second electrode and the second passivation protection functional layer. A material of the second passivation protection functional layer includes zirconia.

Alternatively, in some embodiments of the present disclosure, a material of the electron transport layer is selected from one or more of ZnO, $TiO_2$, $SnO_2$, $Ta_2O_3$, NiO, TiLiO, ZnAlO, ZnMgO, ZnSnO, ZnLiO, and InSnO.

Alternatively, in some embodiments of the present disclosure, the second passivation protection functional layer is a composite electron transport layer. A material of the composite electron transport layer includes zirconia and an oxide semiconductor material, and the zirconia is doped in the oxide semiconductor material.

Alternatively, in some embodiments of the present disclosure, a molar proportion of the zirconia in the material of the composite electron transport layer ranges from 3% to 10%.

Alternatively, in some embodiments of the present disclosure, the oxide semiconductor material is selected from one or more of ZnO, $TiO_2$, $SnO_2$, $Ta_2O_3$, NiO, TiLiO, ZnAlO, ZnMgO, ZnSnO, ZnLiO, and InSnO.

Correspondingly, the present disclosure further provides preparation method for a preparation method for a light-emitting device including following steps:

forming a first passivation protection functional layer on a side of the first electrode; forming a light-emitting layer on a side of the first passivation protection functional layer away from the first electrode, wherein a laser damage threshold of the first passivation protection functional layer is greater than a laser damage threshold of the light-emitting layer; forming a second passivation protection functional layer on a side of the light-emitting layer away from the first passivation protection functional layer, wherein a laser damage threshold of the second passivation protection functional layer is greater than that of the light-emitting layer; and forming a second electrode on a side of the second passivation protection functional layer away from the light-emitting layer.

Alternatively, in some embodiments of the present disclosure, the method further includes a following step: forming a hole layer between the first electrode and the first passivation protection functional layer. A material of the first passivation protection functional layer includes zirconia.

Alternatively, in some embodiments of the present disclosure, a material for forming the light-emitting layer is selected from one or more of group II-VI compound, group III-V compound, group II-V compound, group III-VI compound, group IV-VI compound, group I-III-VI compound, group II-IV-VI compound, and group IV compound.

Alternatively, in some embodiments of the present disclosure, a material for forming the first electrode is selected from one or more of indium-doped tin oxide, fluorine-doped tin oxide, antimony-doped tin oxide, and aluminum-doped zinc oxide. A material for forming the second electrode is selected from one or more of a metal material, a carbon material, and a metal oxide material.

Alternatively, in some embodiments of the present disclosure, the method further includes a following step: forming an electron transport layer between the second electrode and the second passivation protection functional layer. A material for forming the second passivation protection functional layer includes zirconia.

Alternatively, in some embodiments of the present disclosure, a material for forming the electron transport layer is selected from one or more of $ZnO$, $TiO_2$, $SnO_2$, $Ta_2O_3$, $NiO$, $TiLiO$, $ZnAlO$, $ZnMgO$, $ZnSnO$, $ZnLiO$, and $InSnO$.

Alternatively, in some embodiments of the present disclosure, the second passivation protection functional layer is a composite electron transport layer. A material for forming the composite electron transport layer includes zirconia and an oxide semiconductor material, and the zirconia is doped in the oxide semiconductor material.

Alternatively, in some embodiments of the present disclosure, a molar proportion of the zirconia in the material of the composite electron transport layer ranges from 3% to 10%.

Alternatively, in some embodiments of the present disclosure, a material of the oxide semiconductor is selected from one or more of $ZnO$, $TiO_2$, $SnO_2$, $Ta_2O_3$, $NiO$, $TiLiO$, $ZnAlO$, $ZnMgO$, $ZnSnO$, $ZnLiO$, and $InSnO$.

Correspondingly, the present disclosure further provides a display apparatus. The display apparatus includes the light-emitting device, or the display apparatus includes the light-emitting device prepared by the preparation method for a light-emitting device.

Advantageous Effects

In the present disclosure, the first passivation protection functional layer and the second passivation protection functional layer are disposed on both sides of the light-emitting layer, and the laser damage threshold of the first passivation protection functional layer and the laser damage threshold of the second passivation protection functional layer are both greater than that of the light-emitting layer, thus to protect both sides of the light-emitting layer against light, to increase a laser damage threshold of the light-emitting device, and to reduce a probability of optical catastrophe damage occurring in the light-emitting device, thereby increasing a service life of the light-emitting layer.

BRIEF DESCRIPTION OF FIGURES

In order to more clearly explain the technical solutions in the embodiments of the present disclosure, the figures to be used in the description of the embodiments are briefly described below. It is apparent that the figures in the following description are merely some embodiments of the present disclosure. For those skilled in the art, without involving any creative effort, other figures may be obtained based on these figures.

FIG. 4 is another flowchart showing a preparation method for a light-emitting device according to an embodiment of the present disclosure.

EMBODIMENTS OF THE PRESENT APPLICATION

Figure 1:
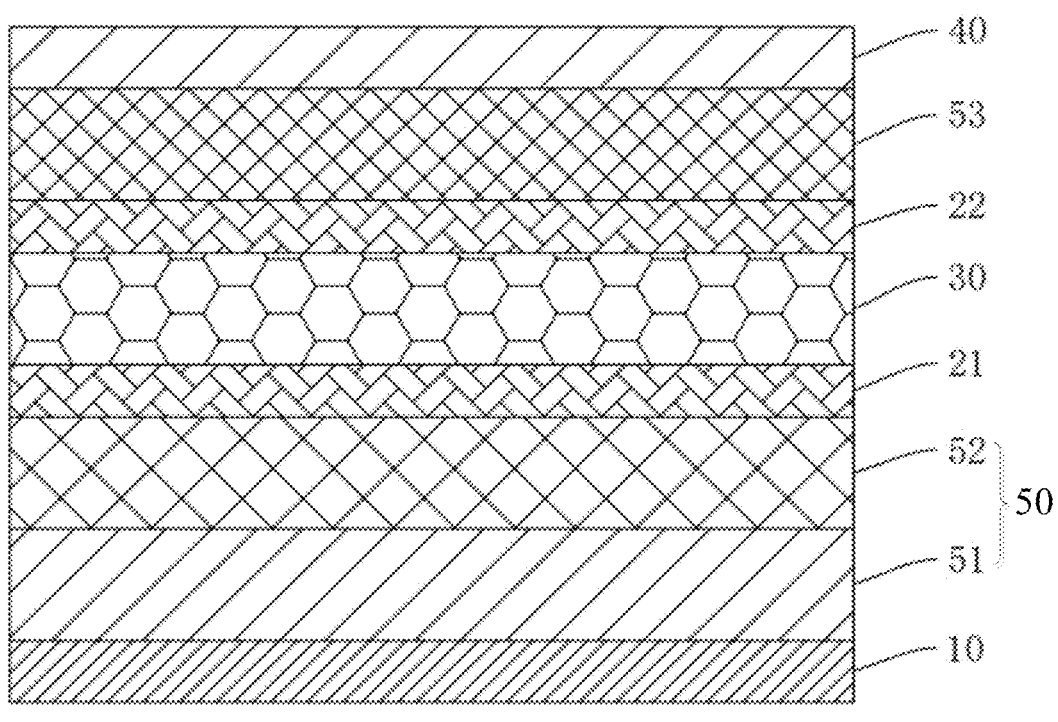
FIG. 1 is a structure schematic diagram of a light-emitting device according to an embodiment of the present disclosure.

Technical solutions in embodiments of the present disclosure will be clearly and completely described below with reference to the figures in the embodiments of the present disclosure. It is apparent that the described embodiments are merely a part of embodiments of the present disclosure, rather than all the embodiments. Based on the embodiments in the present disclosure, all other embodiments obtained by those skilled in the art without creative effort fall within the protection scope of the present disclosure.

The embodiments of the present disclosure provide a light-emitting device, a preparation method therefor, and a display apparatus including the light-emitting device. Detailed description is given below. It should be noted that the order in which the following embodiments are described is not intended to limit the preferred order of the embodiments. Additionally, in the description of the present disclosure, the term "comprising/including" means "comprising/including but not limited to." Various embodiments of the present disclosure may be presented in a form of range. It should be understood that the description in the form of range is merely for convenience and brevity, and should not be construed as a hard limitation on the scope of the disclosure. Therefore, it should be considered that the recited range description has specifically disclosed all possible subranges, as well as a single numerical value within that range. For embodiment, it should be considered that a description of a range from 1 to 6 has specifically disclosed subranges, such as from 1 to 3, from 1 to 4, from 1 to 5, from 2 to 4, from 2 to 6, from 3 to 6, etc., and a single number within the range, such as 1, 2, 3, 4, 5, and 6, regardless of the range. Whenever a range of values is indicated herein, it is meant to include any recited number (fraction or integer) within the indicated range.

In the present disclosure, the term "and/or" is used to describe the association relationship of associated objects, and means that there may be three relationships, for example, "A and/or B" may refer to three relationships: for example, A exists alone, A and B exist at the same time, and B exists alone, where A and B may be singular or plural.

In the present disclosure, the terms "at least one" or "one or more" refer to one or more, and "a plurality of/multiple" refers to two or more. The terms "at least one", "at least one of the followings", or the like, refer to any combination of the items listed, including any combination of a single item or a plurality of items. For example, "at least one of a, b, or c" or "at least one of a, b, and c" may refer to: a, b, c, a-b (i.e., a and b), a-c, b-c, or a-b-c, where a, b, and c may be single or plural (multiple).

In the existing quantum dots light-emitting device, when the light-emitting device is driven for a long time, the quantum dot light-emitting layer emits light and outputs light due to excitation. When an output power gradually increases, a cavity surface region of the quantum dot light-emitting layer absorbs light, which result in generating heat, and eventually produces irreversible optical damage in the quantum dot light-emitting layer, that is, when the semiconductor junction in the quantum dot light-emitting layer exceeds a power density and absorbs too much light energy, it will lead to melting and recrystallization of the cavity surface region. An affected region will generate a large number of lattice defects, which can damage the performance of the quantum dot light-emitting device. Additionally, as a high thermal sensitivity of the quantum dot light-emitting device, laser annealing process is often required during preparation process, while aforementioned issues will also occur during the laser annealing process of the quantum dot light-emitting device.

In order to solve the above technical problems, embodiments of the present disclosure provide a light-emitting device. Referring to FIG. 1 the light-emitting device includes a first electrode 10, a first passivation protection functional layer 21, a light-emitting layer 30, a second passivation protection functional layer 22, and a second electrode 40.

Wherein, the light-emitting layer 30 is disposed between the first electrode 10 and the second electrode 40, the first passivation protection functional layer 21 is disposed between the first electrode 10 and the light-emitting layer 30, the second passivation protection functional layer 22 is disposed between the second electrode 40 and the light-emitting layer 30. A laser damage threshold of the first passivation protection functional layer 21 and a laser damage threshold of the second passivation protection functional layer 22 are both greater than a laser damage threshold of the light-emitting layer 30.

In an process of implementation and disclosure, in the embodiments of the present disclosure, the first passivation protection functional layer 21 and the second passivation protection functional layer 22 are disposed on both sides of the light-emitting layer 30, and the laser damage threshold of the first passivation protection functional layer 21 and the laser damage threshold of the second passivation protection functional layer 22 are both greater than that of the light-emitting layer 30, so as to protect the light-emitting layer against light, thereby effectively reducing a probability of optical damage occurring in the light-emitting layer 30, and improving a yield and a service life of the light-emitting device. Additionally, when the light-emitting device undergoes annealing processes, it can also expand a range of a treatment intensity for the annealing process.

Specifically, please continue to refer to FIG. 1, in an embodiment of the present disclosure, the light-emitting device provided in the embodiment includes the first electrode 10, a hole layer 50 disposed on a side of the first electrode 10, the first passivation protection functional layer 21 disposed on a side of the hole layer 50 away from the first electrode 10, the light-emitting layer 30 disposed on a side of the passivation protection functional layer 21 away from the hole layer 50, the second passivation protection functional layer 22 disposed on a side of the light-emitting layer 30 away from the passivation protection functional layer 21, an electron transport layer 53 disposed on a side of the second passivation protection functional layer 22 away from the light-emitting layer 30, and the second electrode 40 disposed on a side of the electron transport layer 53 away from the second passivation protection functional layer 22.

It should be noted that, in embodiments of the present disclosure, the hole layer 50 includes a hole injection layer 51 and a hole transport layer 52, as is show in FIG. 1. Subsequent embodiments are described with the hole injection layer 51 and the hole transport layer 52, that is, the hole layer includes the hole injection layer 51 disposed on a side of the first electrode 10, and the hole transport layer 52 disposed on a side of the hole injection layer 51 away from the first electrode 10. The first passivation protection functional layer 21 is disposed on a side of the hole transport layer 52 away from the hole injection layer 51.

Wherein, the first electrode 10 may be an anode, the second electrode 40 may be a cathode, that is, in the light-emitting device provided in the embodiments of the present disclosure, the light-emitting layer 30 can emits light by applying a voltage to the first electrode 10 and the second electrode 40, transporting holes through the hole injection layer 51 and the hole transport layer 52, and transporting electrons through the electron transport layer 53.

Furthermore, a material of the first electrode 10 is selected from one or more of indium-doped tin oxide, fluorine-doped tin oxide, antimony-doped tin oxide, and aluminum-doped zinc oxide.

A material of the hole injection layer 51 is selected from one or more of PEDOT:PSS (poly(3,4-ethylenedioxythiophene)-poly(styrenesulfonate)), CuPc (pigment blue 15:3), F4-TCNQ (2,3,5,6-tetrafluoro-7,7',8,8'-tetracyanoquinodimethane), HATCN (2,3,6,7,10,11-hexacyanobuta-1,4,5,8,9,12-hexaazatriphenylene), transition metal oxide, and transition metal sulfide compound.

A material of the hole transport layer 52 is selected from one or more of Poly(9,9-dioctylfluorene-co-N-(4-butylphenyl)diphenylamine), Polyvinylcarbazole, Poly(N,N'-bis(4-butylphenyl)-N,N'-diphenylbenzidine), Poly(9,9-dioctylfluorene-co-bis-N,N-diphenyl-1,4-phenylenediamine), 4,4',4"-Tri(carbazol-9-yl)triphenylamine, 4,4'-Bis(9-carbazolyl)biphenyl, N,N'-diphenyl-N,N'-bis(3-methylphenyl)-1,1'-biphenyl-4,4'-diamine, 15N,N'-diphenyl-N,N'-(1-naphthyl)-1,1'-biphenyl-4,4'-diamine, Graphene, and C60.

A material of the light-emitting layer 30 is selected from one or more of group II-VI compound, group III-V compound, group II-V compound, group III-VI compound, group IV-VI compound, group I-III-VI compound, group II-IV-VI compound, and group IV compound. Wherein, the material of the light-emitting layer 30 includes a direct bandgap compound semiconductor that possess light emitting capability.

Specifically, the material of the light-emitting layer 30 may also be a nanocrystal of II-VI semiconductor, for example, CdS, CdSe, CdTe, ZnS, ZnSe, ZnTe, HgS, HgSe, HgTe, PbS, PbSe, PbTe, and other binary II-VI compound, ternary II-VI compound, and quaternary II-VI compound.

The material of the light-emitting layer 30 may also be a nanocrystal of III-V semiconductor, for example, GaP, GaAs, InP, InAs, and other binary III-V compound, ternary III-V compound, and quaternary III-V compound.

Furthermore, the material of the light-emitting layer 30 may also be a doped or undoped inorganic perovskite semiconductor, and/or an organic-inorganic hybrid perovskite semiconductor.

Specifically, a structural formula of the inorganic perovskite semiconductors is $AMX_3$, wherein, A is $Cs^+$ ion; M is a divalent metal cation, the divalent metal cation may include but not limited to $Pb^{2+}$, $Sn^{2+}$, $Cu^{2+}$, $Ni^{2+}$, $Cd^{2+}$, $Cr^{2+}$, $Mn^{2+}$, $Co^{2+}$, $Fe^{2+}$, $Ge^{2+}$, $Yb^{2+}$, and $Eu^{2+}$; X is a halide anion, the halide anion may include but not limited to $Cl^-$, $Br^-$, and $I^-$. A structural formula of the organic-inorganic hybrid perovskite semiconductor is $BMX_3$, wherein, B is an organic amine cation, and the structural formula of the organic-inorganic hybrid perovskite semiconductor includes $CH_3(CH_2)_{n-2}NH_3^+(n{\geq}2)$ or $NH_3(CH_2)_nNH3^{2+}(n{\geq}2)$. When n=2, an inorganic metal halide octahedron $MX_6^{4-}$ are connected through shared vertices, wherein, the metal cation M is located at a center of the halide octahedron, and the organic amine cation B fills in a void between the octahedron, thus forming an infinitely extended three-dimensional structure. When n>2, the inorganic metal halide octahedron $MX_6^{4-}$ connected through shared vertices extend in a two-dimensional direction to form a layered structure, and organic amine cation bilayers (protonated monoamine) or organic amine cation monolayers (protonated diamine) are inserted between layers of the layered structure, and organic layers overlapping with inorganic layers to form a stable two-dimensional layered structure. M is a divalent metal cation including $Pb^{2+}$, $Sn^{2+}$, $Cu^{2+}$, $Ni^{2+}$, $Cd^{2+}$, $Cr^{2+}$, $Mn^{2+}$, $Co^{2+}$, $Fe^{2+}$, $Ge^{2+}$, $Yb^{2+}$, and $Eu^{2+}$; X is a halide anion, the halide anion includes but not limited to $Cl^-$, $Br^-$, and $I^-$.

A material of the electron transport layer 53 is selected from an oxide semiconductor nanoparticle material with electron transport capability, for example, one or more of ZnO, $TiO_2$, $SnO_2$, $Ta_2O_3$, NiO, TiLiO, ZnAlO, ZnMgO, ZnSnO, ZnLiO, and InSnO.

A material of the second electrode 40 is selected from one or more of a metal material, a carbon material, and a metal oxide material. Wherein, the metal material is selected from one or more of Al, Ag, Cu, Mo, Au, Ba, Ca, and Mg. the carbon material is selected from one or more of graphite, carbon nanotubes, graphene, and carbon fiber. The metal oxide material may be a doped or undoped metal oxide, specifically can be selected from one or more of ITO, FTO, ATO, AZO, GZO, IZO, MZO, and AMO.

In addition, the second electrode 40 can also be a composite electrode that metal sandwiched between doped or undoped transparent metal oxides. Wherein, the composite electrode may be selected from one or more of AZO/Ag/AZO, AZO/Al/AZO, ITO/Ag/ITO, ITO/Al/ITO, ZnO/Ag/ZnO, ZnO/Al/ZnO, $TiO_2$/Ag/$TiO_2$, $TiO_2$/Al/$TiO_2$, ZnS/Ag/ZnS, ZnS/Al/ZnS, $TiO_2$/Ag/$TiO_2$, and $TiO_2$/Al/$TiO_2$.

Undertake the above, in embodiments of the present application, the material of the first passivation protection functional layer 21 and the material of the second passivation protection functional layer 22 both includes zirconia, that is, both sides of the light-emitting layer 30 is disposed with zirconia passivation film. As during a preparation process of the zirconia, a monoclinic phase structure with a higher laser damage threshold will formed, thus can effectively protect the light-emitting layer 30 against light damage, thereby increasing the laser damage threshold of the light-emitting device, so as to improve the service life of the light-emitting device and expand the range of processing intensity for annealing processes.

It should be noted that, due to an insulating properties of the zirconium dioxide, in order to reduce impacts of the first passivation protection layer 21 and the second passivation protection layer 22 on the electrical characteristics of the light-emitting device, thereby in the embodiment, both a thickness of the first passivation protection layer 21 and a thickness of the second passivation protection layer 22 are less than or equal to 10 nm.

Figure 2:
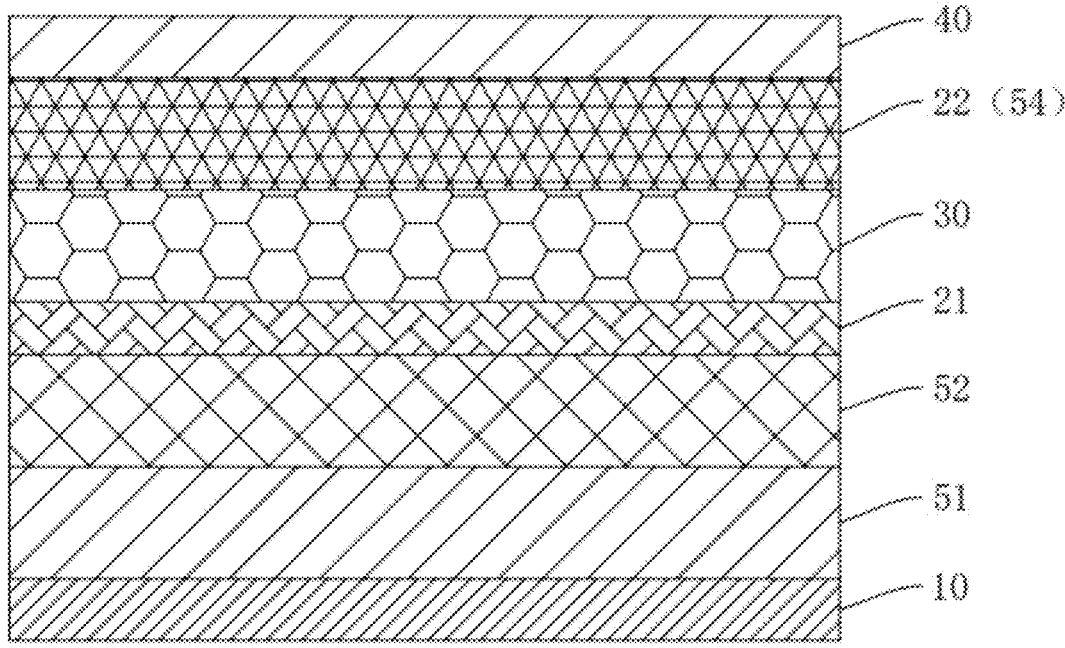
FIG. 2 is another structure schematic diagram of a light-emitting device according to an embodiment of the present disclosure.

Referring to FIG. 2, in another embodiment of the present application, the light-emitting device includes the first electrode 10, the hole injection layer 51 disposed on a side of the first electrode 10, the hole transport layer 52 disposed on a side of the hole injection layer 51 away from the first electrode 10, the first passivation protection functional layer 21 disposed on a side of the hole transport layer 52 away from the hole injection layer 51, the light emitting layer 30 disposed on a side of the first passivation protection functional layer 21 away from the hole transport layer 52, the second passivation protection functional layer 22 disposed on a side of the light-emitting layer 30 away from the first passivation protection functional layer 21, and the second electrode 40 disposed on a side of the second passivation protection functional layer 22 away from the light-emitting layer 30.

The present embodiment differs from the previous embodiment in that, the second passivation protection functional layer 22 is multiplexed as a composite electron transport layer 54, furthermore, a subsequent description is described with the composite electron transport layer 54. Specifically, in the embodiment, a material of the composite electron transport layer 54 includes an oxide semiconductor material and zirconia, wherein, the zirconia is doped in the oxide semiconductor material, thereby the composite electron transport layer 54 can realize a function of electron transport while increasing the laser damage threshold of the light-emitting device.

Alternatively, the oxide semiconductor material is selected from one or more of ZnO, $TiO_2$, $SnO_2$, $Ta_2O_3$, NiO, TiLiO, ZnAlO, ZnMgO, ZnSnO, ZnLiO, and InSnO.

Alternatively, a molar proportion of the zirconia in the material of the composite electron transport layer 54 ranges from 3% to 10%.

It should be noted that, for a quantum dot light-emitting device, an electron injection ability is much greater than a hole injection ability, which makes a charge imbalance appear in the light-emitting device, thereby makes an efficiency of the low at low luminance, and the service life of the light-emitting device reduced at low luminance, that is an electrical properties and a luminous performance of the light-emitting device are impacted greatly. In the present embodiment, the composite electron transport layer 54 is formed by doping zirconia in the oxide semiconductor material. Since the zirconia has certain insulating property, the electron injection ability of the light-emitting device can be reduced to improve the charge balance of the light-emitting device, thereby effectively improving a light-emitting efficiency of the light-emitting device. In particular, the light-emitting efficiency of the light-emitting device at low luminance can be greatly improved, and the service life of the light-emitting device can also be prolonged.

Undertake the above, in the embodiments of the present application, the first passivation protection functional layer 21 and the composite electron transport layer 54 are respectively arranged on both sides of the light-emitting layer 30 of the light-emitting device, and the laser damage threshold of the first passivation protection functional layer 21 and the laser damage threshold of the composite electron transport layer 54 are both larger than the laser damage threshold of the light-emitting layer 30, so as to play an anti-light protection role on the light-emitting layer 30, thereby effectively reducing the probability of optical damage of the light-emitting layer 30, and improving the yield and the service life of the light-emitting device. Meanwhile, when the light-emitting device is treated by annealing process, a treatment strength range of the annealing process can also be expanded. In addition, in the embodiments of the present application, the composite electron transport layer 54 is doped with zirconia the embodiments of the present application, so that the charge balance of the light-emitting device can be improved on the basis of improving the laser damage threshold of the light-emitting device, so as to improve the efficiency and the service life of the light-emitting device.

Figure 3:
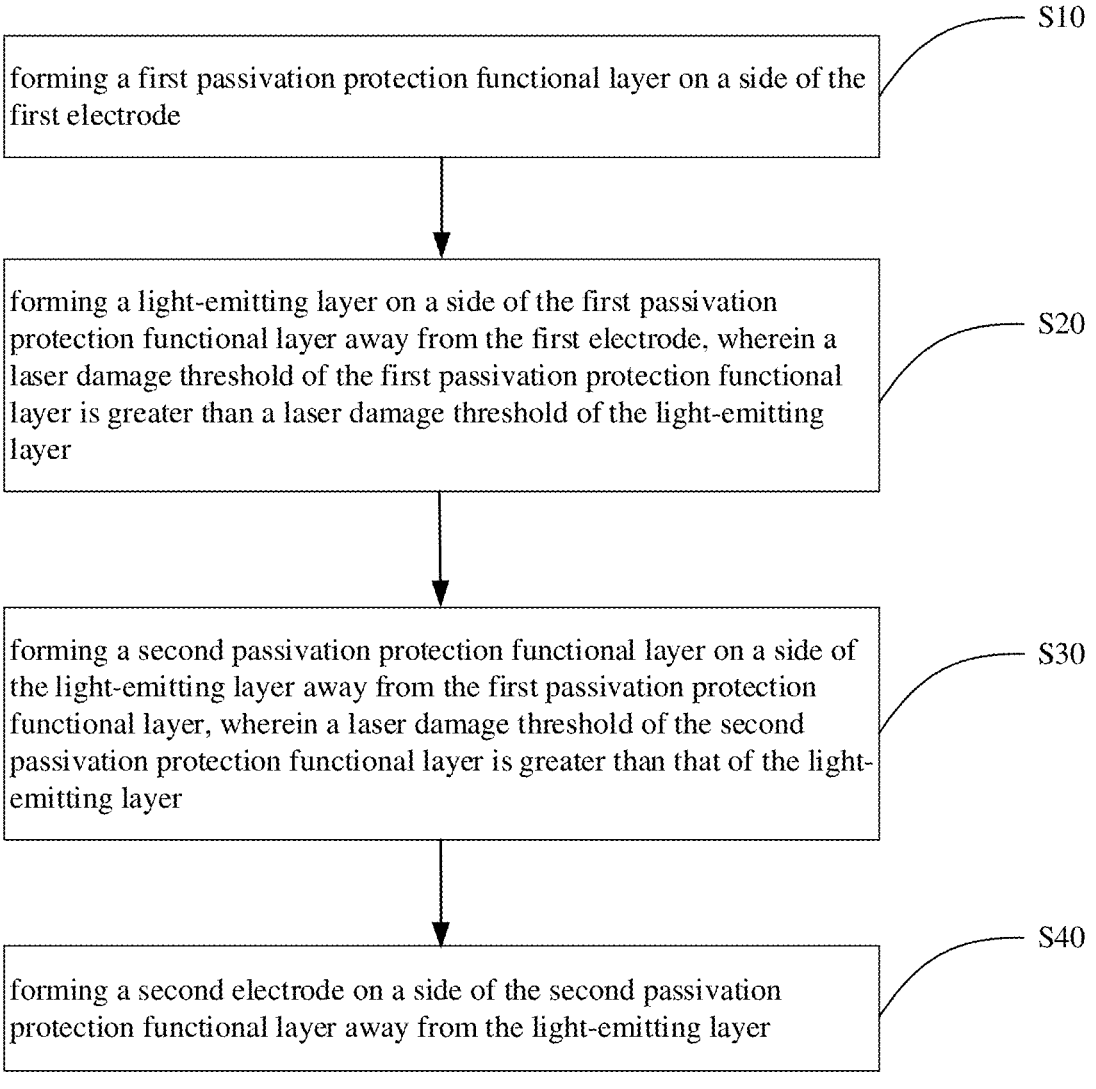
FIG. 3 is a flowchart showing a preparation method for a light-emitting device according to an embodiment of the present disclosure.

In addition, the embodiment of the invention further provides a preparation method for a light-emitting device, and the light-emitting device is the light-emitting device described in the above embodiments. Please refer to FIG. 1, FIG. 2, and FIG. 3, and the preparation method for the light-emitting device includes following steps:

S10, forming a first passivation protection functional layer 21 on a side of the first electrode 10.

A substrate (not shown in the FIGs) is provided, and the first electrode 10 is formed on the substrate. A material of the first electrode 10 is selected from one or more of indium-doped tin oxide, fluorine-doped tin oxide, antimony-doped tin oxide, and aluminum-doped zinc oxide.

In an embodiment, referring to FIG. 4, step S10 is followed by S11: forming a hole layer 50 on a side of the first electrode 10 away from the substrate. Specifically, a hole injection layer 51 and a hole transport layer 52 may be formed in sequence, so as to form the hole layer 50 between the first electrode 10 and the first passivation protection functional layer 21. Specifically, the hole injection layer 51 and the hole transport layer 52 can be prepared by spin coating. Correspondingly, in a subsequent step S20, a light-emitting layer is formed on a side of the hole layer away from the first passivation protection functional layer.

Alternatively, a material of the hole injection layer 51 is selected from one or more of PEDOT:PSS (poly(3,4-ethylenedioxythiophene)-poly(styrenesulfonate)), CuPc (pigment blue 15:3), F4-TCNQ (2,3,5,6-tetrafluoro-7,7',8,8'-tetracyanoquinodimethane), HATCN (2,3,6,7,10,11-hexacyanobuta-1,4,5,8,9,12-hexaazatriphenylene), transition metal oxide, and transition metal sulfide compound.

Alternatively, a material of the hole transport layer 52 is selected from one or more of Poly(9,9-dioctylfluorene-co-N-(4-butylphenyl)diphenylamine), Polyvinylcarbazole, Poly(N,N'-bis(4-butylphenyl)-N,N'-diphenylbenzidine), Poly(9,9-dioctylfluorene-co-bis-N,N-diphenyl-1,4-phenylenediamine), 4,4',4''-Tri(carbazol-9-yl)triphenylamine, 4,4'-Bis(9-carbazolyl)biphenyl, N,N'-diphenyl-N,N'-bis(3-methylphenyl)-1,1'-biphenyl-4,4'-diamine, 15N,N'-diphenyl-N,N'-(1-naphthyl)-1,1'-biphenyl-4,4'-diamine, Graphene, and C60.

The first passivation protection functional layer 21 is formed on a side of the hole transport layer 52 away from the hole injection layer 51, and the first passivation protection functional layer 21 can be formed by evaporation.

In the embodiments of the present disclosure, a material of the first passivation protection functional layer 21 includes zirconia, and a thickness of the first passivation protection functional layer 21 is less than or equal to 10 nm, so as not to affect the electrical characteristics of the light-emitting device on the basis of improving the laser damage threshold of the light-emitting device.

S20, forming a light-emitting layer 30 on a side of the first passivation protection functional layer 21 away from the first electrode 10, wherein a laser damage threshold of the first passivation protection functional layer 21 is greater than a laser damage threshold of the light-emitting layer 30.

Forming a light-emitting layer 30 on a side of the first passivation protection functional layer 21 away from the hole transport layer 52, wherein a laser damage threshold of the first passivation protection functional layer 21 is greater than a laser damage threshold of the light-emitting layer 30. Specifically, the light-emitting layer 30 can be formed by spin coating.

Alternatively, a material of the light-emitting layer 30 is selected from one or more of group II-VI compound, group III-V compound, group II-V compound, group III-VI compound, group IV-VI compound, group I-III-VI compound, group II-IV-VI compound, and group IV compound. Wherein, the material of the light-emitting layer 30 includes a direct bandgap compound semiconductor that possess light emitting capability.

Specifically, the material of the light-emitting layer 30 may also be a nanocrystal of II-VI semiconductor, for example, CdS, CdSe, CdTe, ZnS, ZnSe, ZnTe, HgS, HgSe, HgTe, PbS, PbSe, PbTe, and other binary II-VI compound, ternary II-VI compound, and quaternary II-VI compound.

The material of the light-emitting layer 30 may also be a nanocrystal of III-V semiconductor, for example, GaP, GaAs, InP, InAs, and other binary III-V compound, ternary III-V compound, and quaternary III-V compound.

Furthermore, the material of the light-emitting layer 30 may also be a doped or undoped inorganic perovskite semiconductor, and/or an organic-inorganic hybrid perovskite semiconductor.

Specifically, a structural formula of the inorganic perovskite semiconductors is $AMX_3$, wherein, A is $Cs^+$ ion; M is a divalent metal cation, the divalent metal cation may include but not limited to $Pb^{2+}$, $Sn^{2+}$, $Cu^{2+}$, $Ni^{2+}$, $Cd^{2+}$, $Cr^{2+}$, $Mn^{2+}$, $Co^{2+}$, $Fe^{2+}$, $Ge^{2+}$, $Yb^{2+}$, and $Eu^{2+}$; X is a halide anion, the halide anion may include but not limited to $Cl^-$, $Br^-$, and $I^-$. A structural formula of the organic-inorganic hybrid perovskite semiconductor is $BMX_3$, wherein, B is an organic amine cation, and the structural formula of the organic-inorganic hybrid perovskite semiconductor includes $CH_3(CH_2)_{n-2}NH_3^+(n \geq 2)$ or $NH_3(CH_2)_nNH3^{2+}(n \geq 2)$. When n=2, an inorganic metal halide octahedron $MX_6^{4-}$ are connected through shared vertices, wherein, the metal cation M is located at a center of the halide octahedron, and the organic amine cation B fills in a void between the octahedron, thus forming an infinitely extended three-dimensional structure. When n>2, the inorganic metal halide octahedron $MX_6^{4-}$ connected through shared vertices extend in a two-dimensional direction to form a layered structure, and organic amine cation bilayers (protonated monoamine) or organic amine cation monolayers (protonated diamine) are inserted between layers of the layered structure, and organic layers overlapping with inorganic layers to form a stable two-dimensional layered structure. M is a divalent metal cation including $Pb^{2+}$, $Sn^{2+}$, $Cu^{2+}$, $Ni^{2+}$, $Cd^{2+}$, $Cr^{2+}$, $Mn^{2+}$, $Co^{2+}$, $Fe^{2+}$, $Ge^{2+}$, $Yb^{2+}$, and $Eu^{2+}$; X is a halide anion, the halide anion includes but not limited to $Cl^-$, $Br^-$, and $I^-$.

S30, forming a second passivation protection functional layer 22 on a side of the light-emitting layer 30 away from the first passivation protection functional layer 21, wherein a laser damage threshold of the second passivation protection functional layer 22 is greater than that of the light-emitting layer 30.

In an embodiment of the present disclosure, the second passivation protection functional layer 22 is formed on a side of the light emitting layer 30 away from the first passivation protection functional layer 21 by evaporation, and the laser damage threshold of the second passivation protection functional layer 22 is greater than that of the light emitting layer 30.

Wherein, a material of the second passivation protection functional layer 22 is zirconia, and a thickness of the second passivation protection functional layer 22 is less than or equal to 10 nm.

In one embodiment, referring to FIG. 4, step S30 is followed by step S31: forming an electron transport layer 53 on a side of the second passivation protection functional layer 22 away from the light-emitting layer 30. The electron transport layer 53 can be formed by spin coating. Accordingly, in a subsequent step S40, a second electrode 40 is formed on a side of the electron transport layer 53 away from the second passivation protection functional layer 22.

Alternatively, a material of the electron transport layer 53 is selected from an oxide semiconductor nanoparticle material with electron transport capability, for example, one or more of ZnO, $TiO_2$, $SnO_2$, $Ta_2O_3$, NiO, TiLiO, ZnAlO, ZnMgO, ZnSnO, ZnLiO, and InSnO.

In another embodiment of the present disclosure, zirconia is doped in an oxide semiconductor material to form a mixed material, and then a second passivation protection functional layer 22 is formed by spin coating the mixed material on a side of the light-emitting layer 30 away from the first passivation protection functional layer 21. That is, the second passivation protection functional layer 22 is also multiplexed as a composite electron transport layer 54, which can also play a role in transporting electrons on the basis of improving the laser damage threshold of the light-emitting device. Wherein, a molar proportion of zirconia in the material of the composite electron transport layer 54 ranges from 3% to 10%.

Alternatively, the oxide semiconductor material is selected from one or more of ZnO, $TiO_2$, $SnO_2$, $Ta_2O_3$, NiO, TiLiO, ZnAlO, ZnMgO, ZnSnO, ZnLiO, and InSnO.

S40, forming a second electrode 40 on a side of the second passivation protection functional layer 22 away from the light-emitting layer 30.

Specifically, the second electrode 40 may be formed on a side of the second passivation protection functional layer 22 away from the light-emitting layer 30 by evaporation.

Alternatively, a material of the second electrode 40 is selected from one or more of a metal material, a carbon material, and a metal oxide material. Wherein, the metal material is selected from one or more of Al, Ag, Cu, Mo, Au, Ba, Ca, and Mg. the carbon material is selected from one or more of graphite, carbon nanotubes, graphene, and carbon fiber. The metal oxide material may be a doped or undoped metal oxide, specifically can be selected from one or more of ITO, FTO, ATO, AZO, GZO, IZO, MZO, and AMO.

In addition, the second electrode 40 can also be a composite electrode that metal sandwiched between doped or undoped transparent metal oxides. Wherein, the composite electrode may be selected from one or more of AZO/Ag/AZO, AZO/Al/AZO, ITO/Ag/ITO, ITO/Al/ITO, ZnO/Ag/ZnO, ZnO/Al/ZnO, $TiO_2$/Ag/$TiO_2$, $TiO_2$/Al/$TiO_2$, ZnS/Ag/ZnS, ZnS/Al/ZnS, $TiO_2$/Ag/$TiO_2$, and $TiO_2$/Al/$TiO_2$.

The preparation method for a light-emitting device provided by the embodiments of the present disclosure will be described below in connection with specific embodiments.

Example 1

Firstly, forming a first electrode 10 on a substrate by ITO material.

Then, forming a film on a side of the first electrode 10 away from the substrate by spin coating with PEDOT:PSS material, wherein, a rotating speed of the spin coating is 5000 rps, and a time of the spin coating is 30 s. Then, heating the prepared film for 15 minutes, and a temperature of the heating may be 150° C. Finally, resting and cooling for 5 minutes to obtain a hole injection layer 51.

Then, forming a film on a side of the hole injection layer 51 away from the first electrode 10 by spin coating with 8 mg/ml of poly (9,9-dioctylfluorene-CO—N-(4-butylphenyl) diphenylamine), wherein, a rotating speed of the spin coating is 3000 rps, and a time of the spin coating is 30 s. Then, heating the prepared film for 10 minutes, and a temperature of the heating may be 80° C. Finally, resting and cooling for 5 minutes to obtain a hole transport layer 52.

Next, forming a film on a side of the hole transport layer 52 away from the hole injection layer 51 by evaporating with zirconia, so as to form a first passivation protection functional layer 21. Wherein, an evaporation vacuum is less than $10^{-3}$ Pa, a precipitation rate is controlled to 1 Å/s, an evaporation time is 80 s, and a thickness of the first passivation protection functional layer 21 is 8 nm.

Then, forming a film on a side of the first passivation protection functional layer 21 away from the hole transport layer 52 by spin coating with 20 mg/mL of quantum dot material. Wherein, the quantum dot material includes above oxide semiconductor material, a rotating speed of the spin coating is 200 rps, and a time of the spin coating is 30 s. Then, heating the prepared film for 10 minutes, and a temperature of the heating may be 80° C. Finally, resting and cooling for 5 minutes to obtain a light-emitting layer 30.

Next, forming a film on a side of the light-emitting layer 30 away from the first passivation protection functional layer 21 by evaporating with zirconia, so as to form a second passivation protection functional layer 22. Wherein, an evaporation vacuum is less than $10^3$ Pa, a precipitation rate is controlled to 1 Å/s, an evaporation time is 80 s, and a thickness of the second passivation protection functional layer 22 is 8 nm.

Then, forming a film on a side of the second passivation protection functional layer 22 away from the light-emitting layer 30 by spin coating with ZnO. Wherein, a rotating speed of the spin coating is 2000 rps, and a time of the spin coating is 30 s. Then, heating the prepared film for 20 minutes, and a temperature of the heating may be 80° C. Finally, resting and cooling for 5 minutes to obtain an electron transport layer 53, as is shown in FIG. 1.

Finally, forming a film on a side of the electron transport layer 53 away from the light-emitting layer 30 by evaporating with Ag, so as to form a second electrode 40. Wherein, an evaporation vacuum is less than $3 \times 10^{-4}$ Pa, a precipitation rate is 1 Å/s, an evaporation time is 200 s, and a thickness of the second electrode 40 is 20 nm. Encapsulating on a side of the second electrode 40 away from the electron transport layer 53 to obtain a light-emitting device, and denoting the light-emitting device as a light-emitting device T1.

Example 2

Firstly, forming a first electrode 10 on a substrate by ITO material.

Then, forming a film on a side of the first electrode 10 away from the substrate by spin coating with PEDOT:PSS material, wherein, a rotating speed of the spin coating is 5000 rps, and a time of the spin coating is 30 s. Then, heating the prepared film for 15 minutes, and a temperature of the heating may be 150° C. Finally, resting and cooling for 5 minutes to obtain a hole injection layer 51.

Then, forming a film on a side of the hole injection layer 51 away from the first electrode 10 by spin coating with 8 mg/ml of poly (9,9-dioctylfluorene-CO—N-(4-butylphenyl) diphenylamine), wherein, a rotating speed of the spin coating is 3000 rps, and a time of the spin coating is 30 s. Then, heating the prepared film for 10 minutes, and a temperature of the heating may be 80° C. Finally, resting and cooling for 5 minutes to obtain a hole transport layer 52.

Next, forming a film on a side of the hole transport layer 52 away from the hole injection layer 51 by evaporating with zirconia, so as to form a first passivation protection functional layer 21. Wherein, an evaporation vacuum is less than $10^{-3}$ Pa, a precipitation rate is controlled to 1 Å/s, an evaporation time is 80 s, and a thickness of the first passivation protection functional layer 21 is 8 nm.

Then, forming a film on a side of the first passivation protection functional layer 21 away from the hole transport layer 52 by spin coating with 20 mg/mL of quantum dot material. Wherein, the quantum dot material includes above oxide semiconductor material, a rotating speed of the spin coating is 200 rps, and a time of the spin coating is 30 s. Then, heating the prepared film for 10 minutes, and a temperature of the heating may be 80° C. Finally, resting and cooling for 5 minutes to obtain a light-emitting layer 30.

Then, doping zirconia in 30 mg/mL ZnO to form a mixed material, and a molar ratio of zirconia is 5%. Forming a film on a side of the light-emitting layer 30 away from the first passivation protection functional layer 21 by spin coating with the mixed material. Wherein, a rotating speed of the spin coating is 2000 rps, and a time of the spin coating is 30 s. Then, heating the prepared film for 20 minutes, and a temperature of the heating may be 80° C. Finally, resting and cooling for 5 minutes to obtain a second passivation protection functional layer 22. Because the second passivation protection functional layer 22 includes ZnO, so the second passivation protection functional layer 22 is also multiplexed as a composite electron transport layer 54, as is shown in FIG. 2

Finally, forming a film on a side of the composite electron transport layer 54 away from the light-emitting layer 30 by evaporating with Ag, so as to form a second electrode 40. Wherein, an evaporation vacuum is less than $3\times10^{-4}$ Pa, a precipitation rate is 1 Å/s, an evaporation time is 200 s, and a thickness of the second electrode 40 is 20 nm. Encapsulating on a side of the second electrode 40 away from the composite electron transport layer 54 to obtain a light-emitting device, and denoting the light-emitting device as a light-emitting device T2.

Furthermore, the embodiments of the present disclosure provide a Comparative Example, wherein this Comparative Example differs from the above two Examples in that, both sides of the light-emitting layer of the Comparative Example are not provided with the first passivation protection functional layer 21 and the second passivation protection functional layer 22.

Specifically, a preparation method for a light-emitting device provided in the Comparative Example includes:

Firstly, forming an anode on a substrate by ITO material.

Then, forming a film on a side of the anode away from the substrate by spin coating with PEDOT:PSS material, wherein, a rotating speed of the spin coating is 5000 rps, and a time of the spin coating is 30 s. Then, heating the prepared film for 15 minutes, and a temperature of the heating may be 150° C. Finally, resting and cooling for 5 minutes to obtain a hole injection layer.

Then, forming a film on a side of the hole injection layer away from the anode by spin coating with 8 mg/mL of poly (9,9-dioctylfluorene-CO—N-(4-butylphenyl) diphenylamine), wherein, a rotating speed of the spin coating is 3000 rps, and a time of the spin coating is 30 s. Then, heating the prepared film for 10 minutes, and a temperature of the heating may be 80° C. Finally, resting and cooling for 5 minutes to obtain a hole transport layer.

Next, forming a film on a side of the hole transport layer away from the hole injection layer by spin coating with 20 mg/mL of quantum dot material. Wherein, the quantum dot material includes above oxide semiconductor material, a rotating speed of the spin coating is 200 rps, and a time of the spin coating is 30 s. Then, heating the prepared film for 10 minutes, and a temperature of the heating may be 80° C. Finally, resting and cooling for 5 minutes to obtain a quantum dot light-emitting layer.

Next, forming a film on a side of the quantum dot light-emitting layer away from the hole transport layer by spin coating with ZnO. Wherein, a rotating speed of the spin coating is 2000 rps, and a time of the spin coating is 30 s. Then, heating the prepared film for 20 minutes, and a temperature of the heating may be 80° C. Finally, resting and cooling for 5 minutes to obtain an electron transport layer.

Finally, forming a film on a side of the electron transport layer away from the light-emitting layer by evaporating with Ag, so as to form a cathode. Wherein, an evaporation vacuum is less than $3\times10^{-4}$ Pa, a precipitation rate is 1 Å/s, an evaporation time is 200 s, and a thickness of the second electrode 40 is 20 nm. Encapsulating on a side of the cathode away from the electron transport layer to obtain a light-emitting device, and denoting the light-emitting device as a light-emitting device T3.

In the embodiments of the present disclosure, JVL data and service life data of the light-emitting devices T1, T2, and T3 prepared in the above preparation method are tested to obtain the results shown in Table 1 as follows:

TABLE 1

| performance test structure table of light-emitting devices | | | | | |
|---|---|---|---|---|---|
| light-emitting device | L (cd/m²) | T95 (h) | T95_1k nit (h) | C.E (cd/A) | C.E-1000 nit (cd/A) |
| T1 | 61220 | 21.76 | 23734 | 96.1 | 32.4 |
| T2 | 62170 | 26.92 | 30141 | 97.6 | 78.3 |
| T3 | 61540 | 18.56 | 20424 | 96.6 | 30.5 |

It should be noted that, in the Table 1 above, L represents the luminance of the device, and under a same current, the higher the luminance of the device indicates the better the efficiency of the device. T95 indicates the time taken for the luminance of the device to decay from 100% to 95%. Under a same current, the longer the T95 time of the device indicates the better performance and stability of the device. T95-1K represents the time it takes for the device to decay from 100% to 95% at 1000 nit luminance. a value of the T95-1K is calculated from values of L and T95. C.E represents a current efficiency of the device. Under a premise that a light emitting area and a driving current are consistent, the higher the C.E, the better the performance of the device. C.E-1000 nit represents a current efficiency of the device at 1000 nit luminance. On a premise that a luminous area and a driving current are consistent, the higher the C.E-1000 nit, the better the performance of the device. That is, in the above data, T95, T95-1 knit, and C.E.-1000 nit can characterize the laser damage threshold and the degree of charge balance of the light-emitting device.

Undertake the above, it can be seen from the data results in Table 1 that, for the light-emitting device T3, after being driven by a long time of high current (2 mA) constant current, a decay rate of the service life of the device is obviously accelerated (that is, the values of T95 and T95-1k nit are lower), which is due to a device performance attenuation caused by light damage. However, the values of T95 and T95-1k nit of the light-emitting devices T1 and T2 provided by the embodiments of the present disclosure with the first passivation protection functional layer 21 and second passivation protection functional layer 22 are both greater than that of T3. Therefore, it can be indicated that, the embodiments of the present disclosure can effectively improve the laser damage threshold and the service life of the light-emitting device by setting the first passivation protection functional layer 21 and the second passivation protection functional layer 22 on both sides of the light-emitting device.

Furthermore, the values of T95, T95-1k nit and C.E.-1000 nit of the light-emitting devices T1 and T2 are higher than those of the light-emitting device T3 provided in the comparative example. The embodiments of the present disclosure can effectively improve the charge balance of the light-emitting device by respectively arranging the first passivation protection functional layer 21 and the second passivation protection functional layer 22 on both sides of the light-emitting layer 30, thereby improving the efficiency of the light-emitting device. Wherein, the values of T95, T95-1k nit and C.E.-1000 nit of the light-emitting device T2 are higher than those of the light-emitting device T1, which indicating that, compared with directly forming zirconia thin film between the light-emitting layer 30 and the electron transport layer 53, the second passivation protection functional layer 22 (composite electron transport layer 54) being formed by doping zirconia in the oxide semiconductor material in the embodiments of the present disclosure can further improve the charge balance of the light-emitting device and further improve the efficiency of the light-emitting device.

Figure 5:
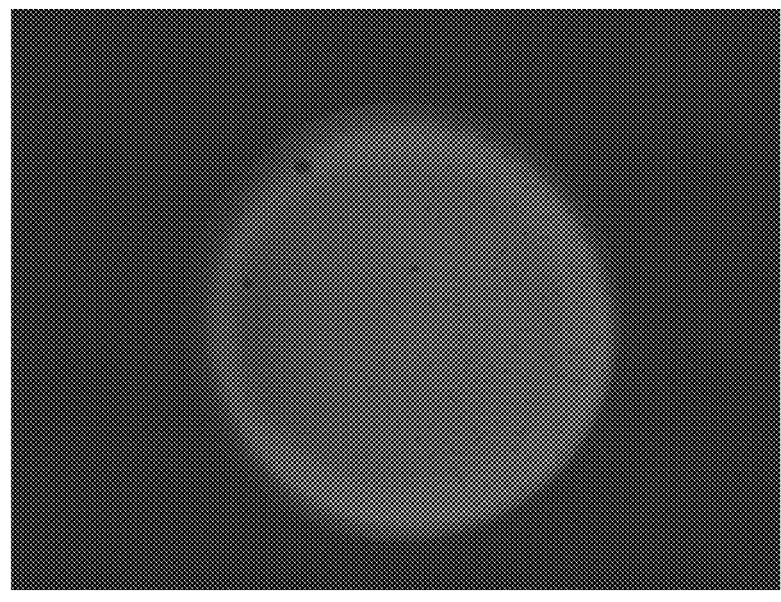
FIG. 5 is an ultraviolet irradiation morphology diagram of a light-emitting device according to an embodiment of the present disclosure.
Figure 6:
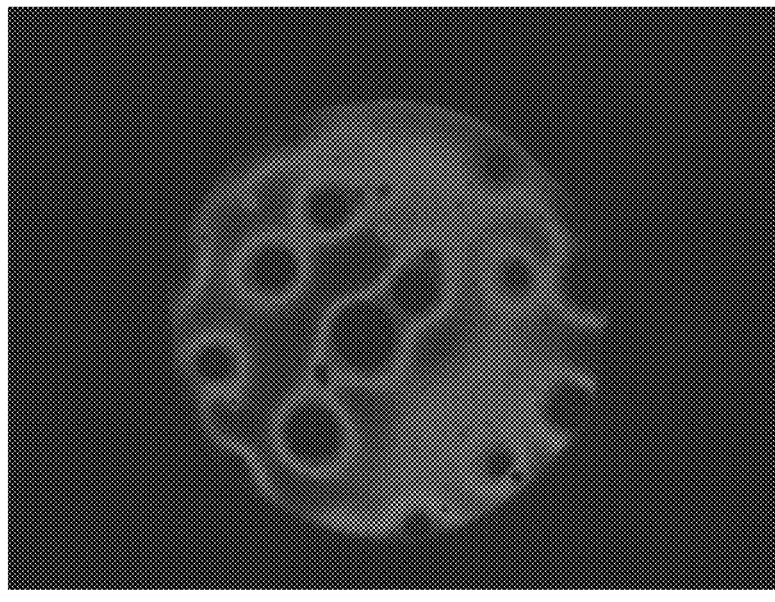
FIG. 6 is an ultraviolet irradiation morphology diagram of a light-emitting device in a comparative embodiment according to an embodiment of the present disclosure.

Furthermore, the embodiments of the present disclosure further perform ultraviolet laser annealing treatment on the light-emitting device T2 and the light-emitting device T3, wherein a pulse width of the ultraviolet laser is 22 ns, a power of the ultraviolet laser is 5 W, a frequency of the ultraviolet laser is 1.2 Hz, and an energy of the laser is 7.5 ev, and then taking electroluminescence images of the light-emitting devices to obtain structures shown in FIG. 5 and FIG. 6.

Wherein, FIG. 5 shows a morphology imaging results of the light-emitting device T2 after the ultraviolet laser annealing treatment, and FIG. 6 shows a morphology imaging results of the light-emitting device T3 after the ultraviolet laser annealing treatment. It can be seen that, the morphology of the light-emitting device T2 remains intact after the ultraviolet laser annealing treatment, while the morphology of the light-emitting device T3 appears black cavity surface, cracks, and grooves after the ultraviolet laser annealing treatment, which makes the light-emitting device T3 seriously damaged, and will seriously affect the luminous efficiency and the service life of the light-emitting device. Therefore, FIG. 4 and FIG. 5 may indicate that, in the embodiments of the present disclosure, the first passivation protection functional layer 21 and the second passivation protection functional layer 22 being respectively arranged on both sides of the light-emitting layer 30 can effectively expand the processing intensity range of the annealing process.

In addition, embodiments of the present disclosure further provide a display apparatus, which comprises the light-emitting device in the above embodiments.

In summary, in the present disclosure, the first passivation protection functional layer 21 and the second passivation protection functional layer 22 are disposed on both sides of the light-emitting layer 30, and the laser damage threshold of the first passivation protection functional layer 21 and the laser damage threshold of the second passivation protection functional layer 22 are both greater than that of the light-emitting layer 30, so as to protect both sides of the light-emitting layer 30 against light, thereby effectively reducing the probability of optical damage occurring in the light-emitting layer 30, and improving the yield and the service life of the light-emitting device. Additionally, when the light-emitting device undergoes annealing processes, it can also expand the range of treatment intensity for the annealing process.

In the above embodiments, the description of each embodiment has its own emphasis, and for parts of one embodiment that are not described in detail, reference can be made to related descriptions of other embodiments.

The light-emitting device, the preparation method therefor, and a display apparatus according to embodiments of the present disclosure are described in detail above. The principles and embodiments of the present disclosure have been described with reference to specific embodiments, and the description of the above embodiments is merely intended to aid in the understanding of the method of the present disclosure and its core idea. At the same time, changes may be made by those skilled in the art to both the specific implementations and the scope of disclosure in accordance with the teachings of the present disclosure. In view of the foregoing, the content of the present specification should not be construed as limiting the disclosure.

What is claimed is:

1. A light-emitting device comprising:
a first electrode;
a first passivation protection functional layer;
a light-emitting layer;
a second passivation protection functional layer; and
a second electrode;
Wherein, the light-emitting layer is disposed between the first electrode and the second electrode, the first passivation protection functional layer is disposed between the first electrode and the light-emitting layer, the second passivation protection functional layer is disposed between the second electrode and the light-emitting layer, and a laser damage threshold of the first passivation protection functional layer and a laser damage threshold of the second passivation protection functional layer are both greater than a laser damage threshold of the light-emitting layer.

2. The light-emitting device according to claim 1, wherein the light-emitting device further comprises a hole layer, and the hole layer is disposed between the first electrode and the first passivation protection functional layer.

3. The light-emitting device according to claim 1, wherein a material of the first passivation protection functional layer comprises zirconia.

4. The light-emitting device according to claim 1, wherein a material of the light-emitting layer is selected from one or more of group II-VI compound, group III-V compound, group II-V compound, group III-VI compound, group IV-VI compound, group I-III-VI compound, group II-IV-VI compound, and group IV compound.

5. The light-emitting device according to claim 1, wherein a material of the first electrode is selected from one or more of indium-doped tin oxide, fluorine-doped tin oxide, antimony-doped tin oxide, and aluminum-doped zinc oxide, and a material of the second electrode is selected from one or more of a metal material, a carbon material, and a metal oxide material.

6. The light-emitting device according to claim 1, wherein the light-emitting device further comprises an electron transport layer, the electron transport layer is disposed between the second electrode and the second passivation protection functional layer, and a material of the second passivation protection functional layer comprises zirconia.

7. The light-emitting device according to claim 6, wherein a material of the electron transport layer is selected from one or more of ZnO, $TiO_2$, $SnO_2$, $Ta_2O_3$, NiO, TiLiO, ZnAlO, ZnMgO, ZnSnO, ZnLiO, and InSnO.

8. The light-emitting device according to claim 1, wherein the second passivation protection functional layer is a composite electron transport layer, and a material of the composite electron transport layer comprises zirconia and an oxide semiconductor material, and the zirconia is doped in the oxide semiconductor material.

9. The light-emitting device according to claim 8, wherein a molar proportion of the zirconia in the material of the composite electron transport layer ranges from 3% to 10%.

10. The light-emitting device according to claim 8, wherein the oxide semiconductor material is selected from one or more of ZnO, $TiO_2$, $SnO_2$, $Ta_2O_3$, NiO, TiLiO, ZnAlO, ZnMgO, ZnSnO, ZnLiO, and InSnO.

11. A preparation method for a light-emitting device comprising the following steps:

forming a first passivation protection functional layer on a side of the first electrode;

forming a light-emitting layer on a side of the first passivation protection functional layer away from the first electrode, wherein a laser damage threshold of the first passivation protection functional layer is greater than a laser damage threshold of the light-emitting layer;

forming a second passivation protection functional layer on a side of the light-emitting layer away from the first passivation protection functional layer, wherein a laser damage threshold of the second passivation protection functional layer is greater than that of the light-emitting layer; and forming a second electrode on a side of the second passivation protection functional layer away from the light-emitting layer.

12. The method according to claim 11, wherein the method further comprises a following step: forming a hole layer between the first electrode and the first passivation protection functional layer, wherein a material of the first passivation protection functional layer comprises zirconia.

13. The method according to claim 11, wherein a material for forming the light-emitting layer is selected from one or more of group II-VI compound, group III-V compound, group II-V compound, group III-VI compound, group IV-VI compound, group I-III-VI compound, group II-IV-VI compound, and group IV compound.

14. The method according to claim 11, wherein a material for forming the first electrode is selected from one or more of indium-doped tin oxide, fluorine-doped tin oxide, antimony-doped tin oxide, and aluminum-doped zinc oxide, and a material for forming the second electrode is selected from one or more of a metal material, a carbon material, and a metal oxide material.

15. The method according to claim 11, wherein the method further comprises a following step: forming an electron transport layer between the second electrode and the second passivation protection functional layer, wherein a material for forming the second passivation protection functional layer comprises zirconia.

16. The method according to claim 15, wherein a material for forming the electron transport layer is selected from one or more of ZnO, $TiO_2$, $SnO_2$, $Ta_2O_3$, NiO, TiLiO, ZnAlO, ZnMgO, ZnSnO, ZnLiO, and InSnO.

17. The method according to claim 11, wherein the second passivation protection functional layer is a composite electron transport layer, a material for forming the composite electron transport layer comprises zirconia and an oxide semiconductor material, and the zirconia is doped in the oxide semiconductor material.

18. The method according to claim 17, wherein a molar proportion of the zirconia in the material of the composite electron transport layer ranges from 3% to 10%.

19. The method according to claim 17, wherein a material of the oxide semiconductor is selected from one or more of ZnO, $TiO_2$, $SnO_2$, $Ta_2O_3$, NiO, TiLiO, ZnAlO, ZnMgO, ZnSnO, ZnLiO, and InSnO.

20. A display apparatus comprising the light-emitting device according to claim 1.

* * * * *